(12) United States Patent
Saito et al.

(10) Patent No.: US 10,083,887 B2
(45) Date of Patent: Sep. 25, 2018

(54) CHIP COMPONENT-EMBEDDED RESIN MULTILAYER SUBSTRATE AND MANUFACTURING METHOD THEREOF

(71) Applicant: Murata Manufacturing Co., Ltd., Kyoto-fu (JP)

(72) Inventors: Yoichi Saito, Kyoto-fu (JP); Toru Yoshioka, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 366 days.

(21) Appl. No.: 14/043,381

(22) Filed: Oct. 1, 2013

(65) Prior Publication Data

US 2014/0029222 A1 Jan. 30, 2014

Related U.S. Application Data

(63) Continuation of application No. PCT/JP2012/053950, filed on Feb. 20, 2012.

(30) Foreign Application Priority Data

Apr. 4, 2011 (JP) ................. 2011-082776

(51) Int. Cl.
*H05K 1/18* (2006.01)
*H01L 23/31* (2006.01)
*H05K 3/46* (2006.01)

(52) U.S. Cl.
CPC ......... *H01L 23/3121* (2013.01); *H05K 1/184* (2013.01); *H05K 1/186* (2013.01);
(Continued)

(58) Field of Classification Search
CPC .......... H05K 1/186–1/187; H05K 3/20; H05K 3/4652
(Continued)

(56) References Cited

U.S. PATENT DOCUMENTS 6,359,235 B1 * 3/2002 Hayashi ................ 174/260
6,538,210 B2 3/2003 Sugaya et al.
(Continued)

FOREIGN PATENT DOCUMENTS

CN 1336790 A 2/2002
EP 1111674 A2 6/2001
(Continued)

OTHER PUBLICATIONS

International Search Report for Application No. PCT/JP2012/053950 dated Mar. 13, 2012.
(Continued)

*Primary Examiner* — Tuan T Dinh
(74) *Attorney, Agent, or Firm* — Pearne & Gordon LLP

(57) ABSTRACT

The present invention provides a chip component-embedded resin multilayer substrate including a laminating body obtained by laminating a plurality of resin layers, a predetermined wiring conductor disposed in the laminating body, and a chip component embedded in the laminating body and having a side terminal electrode. A guarding member electrically isolated from the wiring conductor is provided to cover at least a part of a boundary between the side terminal electrode and the resin layers when viewed from a lamination direction of the laminating body, and the guarding member is formed from a material having a melting point higher than a temperature at which the resin layer begins to flow.

5 Claims, 10 Drawing Sheets

(52) U.S. Cl.
CPC .. *H05K 3/4632* (2013.01); *H01L 2224/16225* (2013.01); *H01L 2924/15313* (2013.01); *H05K 3/4617* (2013.01); *H05K 2201/09781* (2013.01); *H05K 2201/10636* (2013.01); *H05K 2203/063* (2013.01); *Y02P 70/611* (2015.11)

(58) Field of Classification Search
USPC ................. 361/760–766, 792–795, 803; 174/259–262
See application file for complete search history.

(56) References Cited

U.S. PATENT DOCUMENTS

| | | | |
|---|---|---|---|
| 6,596,382 | B2 | 7/2003 | Kawakami |
| 6,930,258 | B1* | 8/2005 | Kawasaki ......... H01L 23/49811 |
| | | | 174/255 |
| 6,931,725 | B2 | 8/2005 | Sugaya et al. |
| 7,608,477 | B2* | 10/2009 | Ikeda ............................ 438/106 |
| 7,706,148 | B2* | 4/2010 | Hsu et al. ..................... 361/790 |
| 2004/0150966 | A1* | 8/2004 | Hu ................................. 361/763 |
| 2005/0103520 | A1* | 5/2005 | Saiki .................... H05K 3/0035 |
| | | | 174/250 |
| 2006/0134907 | A1 | 6/2006 | Ikeda |
| 2008/0007927 | A1* | 1/2008 | Ito et al. ....................... 361/764 |
| 2008/0289866 | A1* | 11/2008 | Yuri ................... H01L 23/49822 |
| | | | 174/260 |

FOREIGN PATENT DOCUMENTS

| | | |
|---|---|---|
| EP | 1776002 A1 | 7/2007 |
| JP | 4-18787 A | 1/1992 |
| JP | 2006-73763 A | 3/2006 |
| JP | 2008-141007 A | 6/2008 |
| JP | 2008-166456 A | 7/2008 |
| WO | 2010/050627 A1 | 5/2010 |
| WO | 2011/083753 A1 | 7/2011 |

OTHER PUBLICATIONS

Written Opinion of the International Searching Authority for Application No. PCT/JP2012/053950 dated Mar. 13, 2012.
Examination Report issued in United Kingdom Patent Application No. GB1317492.5, dated Mar. 25, 2015.
Office action issued in Chinese Appl. No. 201280016727.8 for Resin Multilayer Substrate With Built-In Chip Component and Method for Manufacturing dated Sep. 25, 2015.

* cited by examiner

CHIP COMPONENT-EMBEDDED RESIN MULTILAYER SUBSTRATE AND MANUFACTURING METHOD THEREOF

BACKGROUND OF THE INVENTION

Field of the Invention

The present invention relates to a chip component-embedded resin multilayer substrate and a manufacturing method thereof.

Description of the Related Art

In recent years, various electronic devices such as a mobile communication terminal and a notebook PC are being made to have higher performance and smaller size, and accordingly, various function circuits to be embedded in electronic devices are being made into a modular component.

As such modular component, for example, PTD 1 (Japanese Patent Laying-Open No. 2006-073763) and PTD 2 (Japanese Patent Laying-Open No. 2008-141007) disclose a chip component-embedded resin multilayer substrate in which a chip component is embedded in a rein multilayer substrate obtained by laminating a plurality of thermoplastic resin layers.

When embedding a chip component such as a chip capacitor in the resin multilayer substrate, it is necessary to have an open space disposed in the resin layers for housing the chip component. In order to prevent the chip component from being caught somewhere while housing the chip component, the dimensions of the open space are made slightly greater (with a clearance) than the dimensions of the chip component. As a result, as illustrated in FIG. 1(a), a gap 100 is formed between a side surface of a chip component 5 and resin layers 1.

In the case where a wiring conductor 21 has been formed in the vicinity of gap 100, when a laminating body obtained by laminating resin layers 1 is thermo-compressed, the flowing of the resin as indicated by arrows in FIG. 1(a) may cause wiring conductors 21a and 21b to be deformed as shown in FIG. 1 (b). In some cases, wiring conductors 21a and 21b may accidentally contact (short-circuit) side terminal electrodes 51 of chip component 5.

PTD 1: Japanese Patent Laying-Open No. 2006-073763
PTD 2: Japanese Patent Laying-Open No. 2008-141007

BRIEF SUMMARY OF THE INVENTION

An object of the present invention is to prevent a wiring conductor from being deformed due to the flowing of resin and avoid a contact (short-circuit) between the wiring conductor and a chip component in manufacturing a chip component-embedded resin multilayer substrate.

The present invention provides a chip component-embedded resin multilayer substrate which includes a laminating body obtained by laminating a plurality of resin layers, a predetermined wiring conductor disposed in the laminating body, and a chip component embedded in the laminating body and having a side terminal electrode. A guarding member electrically isolated from the wiring conductor is provided to cover at least a part of a boundary between the side terminal electrode and the resin layers when viewed from a lamination direction of the laminating body, and the guarding member is formed from a material having a melting point higher than a temperature at which the resin layer begins to flow.

Preferably, the guarding member is provided to cover the entire part of the boundary between the resin layers and the side terminal electrode when viewed from the lamination direction of the laminating body.

Preferably, the guarding member is a guarding conductor formed from a conductor material.

Preferably, at least one resin layer is interposed between the guarding conductor and the side terminal electrode of the chip component.

Preferably, the guarding conductor is connected to the side terminal electrode of the chip component through the intermediary of a via conductor.

Preferably, the chip component has two side terminal electrodes disposed respectively on facing end surfaces, and two of the guarding conductors are disposed as being isolated from each other in the vicinity of the side terminal electrodes, respectively.

Preferably, another chip component is mounted on a surface of the laminating body.

The present invention provides a manufacturing method of a chip component-embedded resin multilayer substrate including a laminating body obtained by laminating a plurality of resin layers, a predetermined wiring conductor disposed in the laminating body, and a chip component embedded in the laminating body and having a side terminal electrode. The manufacturing method thereof includes a lamination step of laminating the plurality of the resin layers so as to embed the chip component in an open space disposed in a part of the resin layers, and a thermo-compression step of thermo-compressing the laminating body embedded with the chip component. Before the thermo-compression step, a guarding member electrically isolated from the wiring conductor is provided to cover at least a part of a gap formed between the side terminal electrode and the resin layers when viewed from a lamination direction of the laminating body, and the guarding member is formed from a material having a melting point higher than a temperature at which the resin layer begins to flow.

According to the present invention, since a guarding member electrically isolated from the wiring conductor is provided to cover at least a part of the boundary between the side terminal electrode and the resin layers when viewed from the lamination direction of the laminating body, the amount of resin flowing into the gap from the direction of the guarding member is reduced, and thereby, it is possible to prevent the wiring conductor from being partially deformed. Even if the guarding member is caused to deform due to the flowing of resin and even worse to contact with the chip component due to the deformation, electrical characteristics of the multilayer substrate and the modular component as well will not be affected substantially.

DETAILED DESCRIPTION OF THE INVENTION

Figure 1:
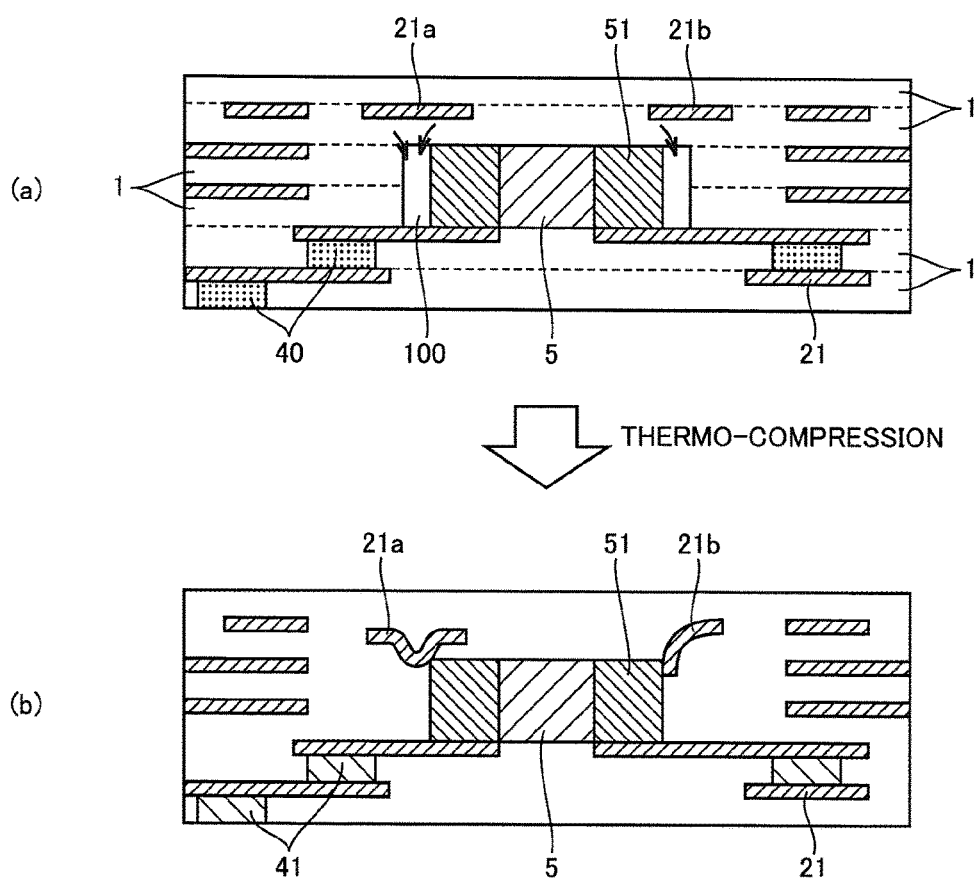
FIG. 1 is a schematic sectional view illustrating a conventional chip component-embedded resin multilayer substrate.

Typically, a chip component-embedded resin multilayer substrate of the present invention is used as a modular component which is integrated with various function circuits and is built in various electronic devices such as a mobile communication terminal and a notebook PC. For example, the chip component-embedded resin multilayer substrate of the present invention may be used as a high-frequency circuit modular component for a front end circuit, a modular power component for a small-sized camera or a liquid crystal display device, a CPU modular component mounted with a CPU, or the like.

The chip component-embedded resin multilayer substrate includes a laminating body obtained by laminating a plurality of resin layers, a predetermined wiring conductor provided on a surface of or inside the laminating body, and a chip component embedded in the laminating body.

A constituent material of the resin layer may be a thermosetting resin such as epoxy resin, however, a thermoplastic resin such as polyimide or liquid crystal polymer is preferred since it is easy to process it into a multilayered body through lamination or compression. In particular, liquid crystal polymer has a high Q value and a low water absorption rate, and thereby it is preferable to be used as a material for the resin layer of the chip component-embedded resin multilayer substrate which is used in a high-frequency circuit module. The thickness of the resin layer is not particularly limited, but preferably is 10 to 100 μm. It is preferable that the whole laminating body is formed from resin layers, but a part of the laminating body may be formed from metal layers and/or ceramic layers.

The laminating body is obtained by laminating a plurality of the resin layers mentioned above, and the predetermined wiring conductor is provided on the surface of or inside the laminating body. The wiring conductor is typically an in-plane conductor pattern disposed in the resin layer along the planar direction, and in particular, it may be a conductor pattern for constituting a functional element such as a capacitor or an inductor, a conductor pattern functioning as a ground electrode, a conductor pattern for connecting various functional elements and chip components, a conductor pattern serving as a pad for joining chip components mounted on the surface, a conductor pattern serving as a pad for joining the resin multilayer substrate to another substrate such as a motherboard. The wiring conductor includes an in-plane conductor pattern disposed in the resin layer along the planar direction and an interlayer conductor pattern disposed in the resin layers along the lamination direction.

Various known materials for a wiring substrate may be used as a material for the wiring conductor, including, for example, copper, silver, aluminum, SUS, nickel and gold, and alloys thereof, and the like. Copper (Cu) is preferred since copper has small specific resistance and small loss in high frequency band. The thickness of the wiring conductor is not particularly limited but preferably is 5 to 50 μm.

The chip component is, for example, a rectangular component body having a side terminal electrode disposed on a side surface thereof. The representative examples of the chip component include passive components such as a chip capacitor, a chip resistor and a chip inductor. In particular, a ceramic chip component having a component body made of dielectric ceramics or magnetic ceramics is preferable due to its stability against heat and pressure in thermo-compressing the resin layer.

In the chip component-embedded resin multilayer substrate of the present invention, a guarding member is provided to cover at least a part of the boundary between the side terminal electrode of the embedded chip component and the resin layers when viewed from the lamination direction of the laminating body. Disposition of the guarding member at such position before thermo-compressing each resin layer in the laminating body causes a gap formed between the side terminal electrode and the resin layers to be covered by the guarding member when viewed from the lamination direction of the laminating body, and thus, during the thermo-compression of each resin layer, the amount of the resin flowing into the gap from the direction of the guarding member is reduced, which makes it possible to prevent the wiring conductor from being deformed partially.

The guarding member is electrically isolated from the wiring conductor. During the thermo-compression, even if the guarding member is deformed due to the flowing of the resin and even contacts with the chip component due to the deformation, since the guarding member is electrically isolated from the wiring conductor, the electrical characteristics of the multilayer substrate and the modular component as well will not be affected substantially. It should be noted that the guarding member electrically isolated from the wiring conductor may be a guarding conductor (a guarding member formed from a conductor material) which is not electrically connected to the wiring conductor or a guarding member formed from an insulating material.

In addition, the guarding member is formed from a material having a melting point higher than a temperature at which the resin layer begins to flow. For example, in the case where the temperature at which the resin layer begins to flow is 300° C., a material having a melting point or a softening temperature higher than 300° C. is used. Accordingly, during the thermo-compression of the resin layers, the guarding member will not begin to flow together with the resin layers, which makes it possible to control the flowing of the resin layers. A conductor material, a ceramic material, a resin material or the like may be given as the material used to form the guarding member, and a conductor material is preferred. Various known materials for the wiring conductor of a multilayer substrate may be used as the conductor material; however, it is preferable that the material of the guarding member is the same as that of the wiring conductor. In the case where the material of the guarding member is the same as that of the wiring conductor, there is no need to perform another step for forming the guarding member, and it is possible to pattern the guarding member (guarding conductor) simultaneously with the wiring conductor, which is advantageous in manufacture.

It is preferable that the guarding member is formed in a planar shape. Moreover, it is preferable that at least one resin layer is interposed between the guarding conductor and the side terminal electrode of the chip component. As mentioned, if the guarding member is configured to adjoin the gap between the chip component and the laminating body through the intermediary of a resin layer, the resin layer flows into the gap during the thermo-compression of the laminating body, which thereby suppresses the deformation of the guarding member to the minimum.

It is preferable that the guarding member is provided to cover the entire part of the boundary between the side terminal electrode and the resin layers when viewed from the lamination direction of the laminating body. Moreover, it is preferable that the guarding member is provided to cover the entire part of the side terminal electrode when viewed from the lamination direction. Disposition of the guarding member in such a way before thermo-compressing the laminating body causes the gap formed between the side terminal electrode and the resin layers to be covered by a greater area when viewed from the lamination direction of the laminating body, which further helps reduce the amount of resin flowing into the gap from the lamination direction, and thereby further reduce the amount of the deformation of the wiring conductor which is arranged to extend in the vicinity of the gap.

It is acceptable that the guarding conductor (guarding member formed from a conductor material) is connected to the side terminal electrode of the chip component through the intermediary of a via conductor. In other words, an electrode of the guarding conductor may not be necessarily connected to the side terminal electrode of the chip component; and it is acceptable that the planar shaped guarding conductor is connected to the side terminal electrode directly or through the intermediary of the via conductor. In the case of making the connection through the intermediary of the via conductor, it is preferable that the via conductor and the side terminal electrode are connected through metal bonding since metal bonding connects firmly the via conductor and the side terminal electrode.

In the case where the embedded chip component has two side terminal electrodes disposed respectively on facing end surfaces, it is preferable that two of the guarding conductors are disposed as being electrically isolated from each other in the vicinity of the side terminal electrodes, respectively. Specifically, in the case where the chip component has a first terminal electrode and a second terminal electrode which are different in potential as the side terminal electrode, it is preferable that an electrically isolated guarding conductor is disposed for each terminal electrode. Moreover, in the case where the chip component has three or more side terminal electrodes, it is preferable that an electrically isolated guarding conductor is disposed in the vicinity of each side terminal electrode. However, in the case where the chip component includes a plurality of side terminal electrodes such as ground terminal electrodes having a common potential, it is acceptable to dispose a common guarding conductor for each of the side terminal electrodes having a common potential. In addition, it is unnecessary to dispose a guarding conductor for all of the side terminal electrodes, and it is acceptable that the guarding conductor is disposed for the side terminal electrodes in the vicinity of which the wiring conductor is disposed. Furthermore, in the case where a plurality of chip components are embedded, it is acceptable to dispose a common guarding electrode for the side surfaces of each chip component having a common potential.

In the chip component-embedded resin multilayer substrate of the present invention, it is acceptable that another chip component is mounted on a surface of the laminating body. The chip component may be a passive component as described above or an active component such as a semiconductor element. In other words, various components such as an active component, a passive component or a connector component may be mounted on the surface of the laminating body. That is to say, the chip component-embedded resin multilayer substrate may be formed into an integrated modular component combining various function circuits.

Embodiment 1

Figure 2:
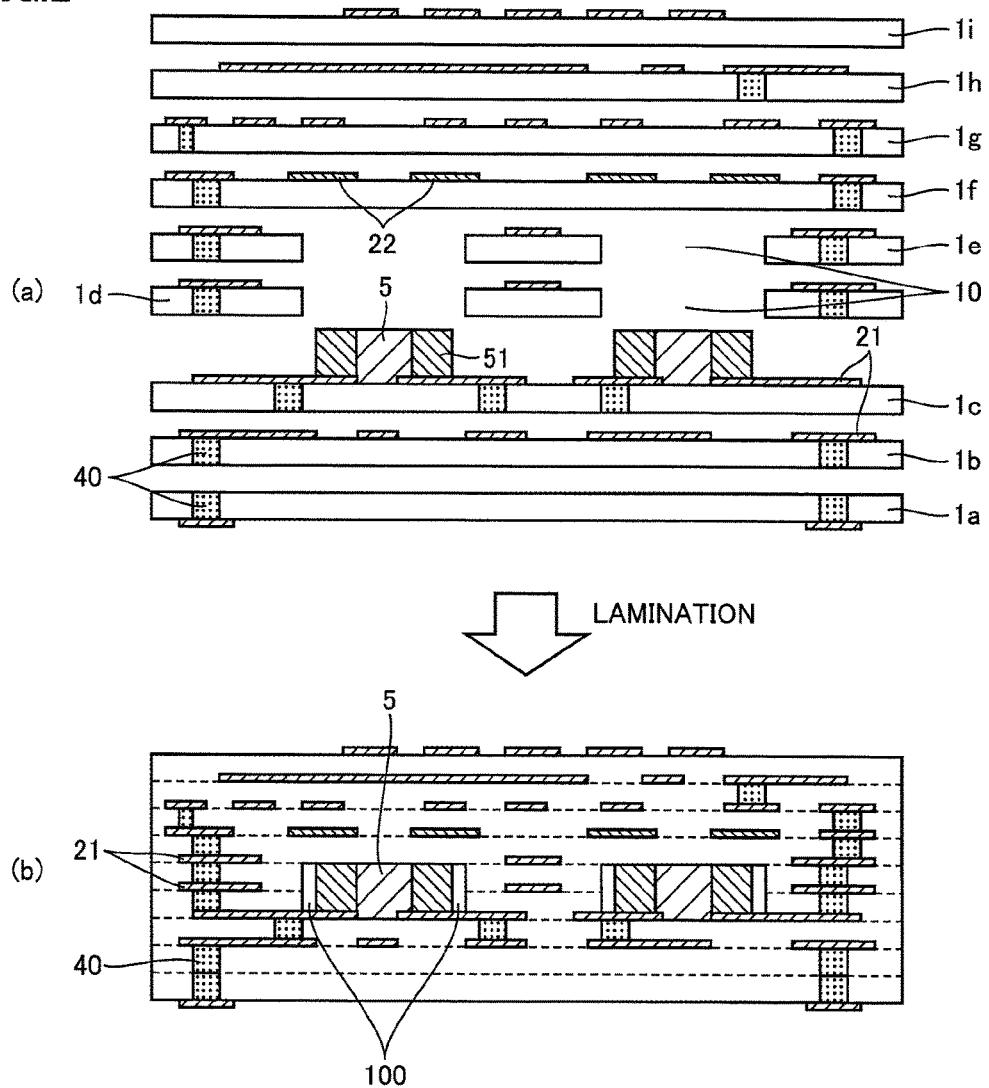
FIG. 2 is a schematic sectional view illustrating a manufacturing step of a chip component-embedded resin multilayer substrate according to Embodiment 1.
Figure 3:
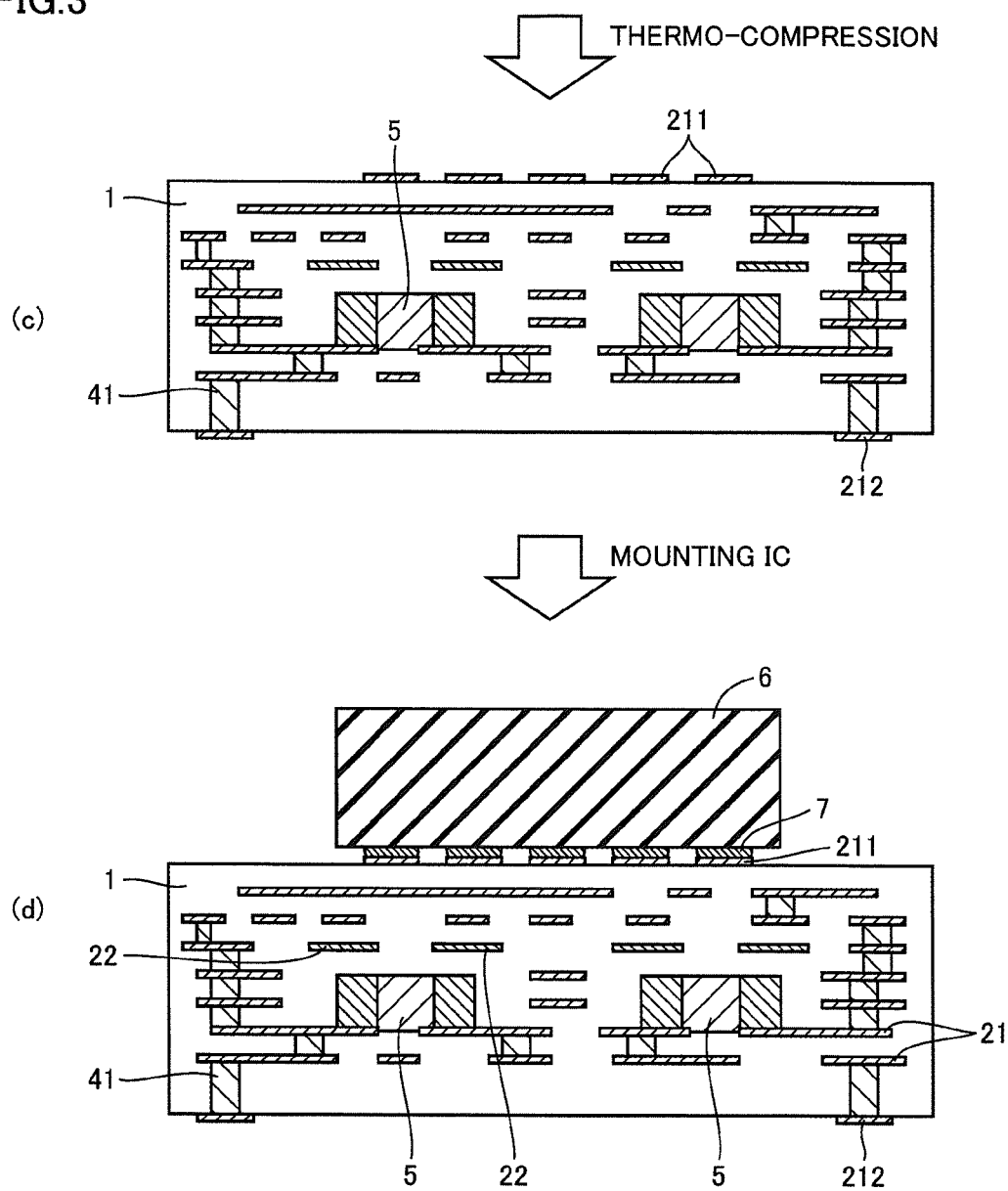
FIG. 3 is another schematic sectional view illustrating a manufacturing step of the chip component-embedded resin multilayer substrate according to Embodiment 1.

The chip component-embedded resin multilayer substrate of the present embodiment is prepared according to the processes illustrated in FIGS. 2 and 3. Resin layers 1a-1i are each formed from a thermoplastic resin and includes a wiring conductor 21 having a predetermined pattern (in-plane conductor pattern) on one of the main surfaces. Wiring conductor 21 is formed by patterning a metal foil containing copper as a main component and provided on one of the main surfaces of each resin layer.

A via hole is formed preliminarily at a required position in each of resin layers 1a-1i, and the via hole is filled with a conducting material 40 containing tin as a main component. Conducting material 40 is metalized to form the via conductor (interlayer conductor pattern) during the thermo-compression of resin layers 1a-1i.

Various known conducting materials (conducting paste) for forming an interlayer conductor pattern in a multilayer substrate may be used as the conducting material. It is preferable that the conducting material contains an appropriate amount of metal powder so as to form an alloy layer with the wiring conductor at the temperature at which the laminating body is thermo-compressed. In the case where the wiring conductor is formed from Cu, for example, such metal powder may contain at least one kind of Ag, Cu and Ni and at least one kind of Sn, Bi and Zn.

In order to prevent a chip component 5 from being caught somewhere while housing the chip component, resin layers 1d and 1e in which chip component 5 is embedded is preliminarily formed with an open space 10 having dimensions slightly greater than the outer dimensions of chip component 5. Further, resin layer 1f adjacent to the upper surface of the embedded chip component 5 is disposed with a guarding member (guarding conductor) 22 on a main surface of resin layer 1f opposite to the surface adjoining to chip component 5. Guarding conductor 22 is an in-plane conductor pattern formed in a process similar to the patterning of wiring conductor 21.

Figure 4:
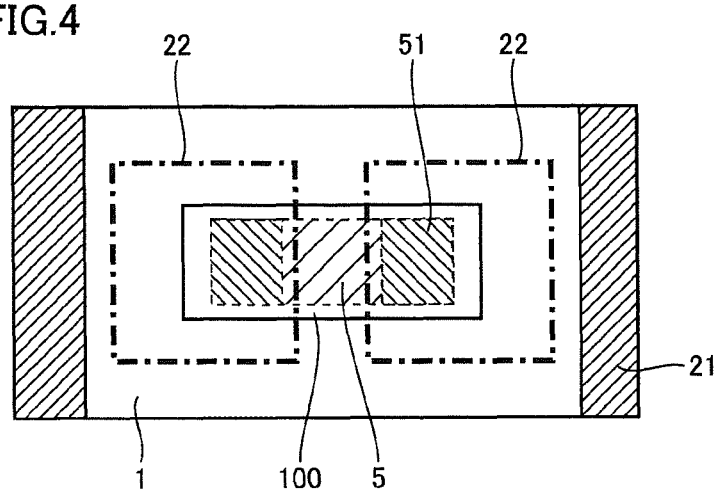
FIG. 4 is a schematic top view illustrating a manufacturing step of the chip component-embedded resin multilayer substrate according to Embodiment 1.

As illustrated in FIG. 4, when viewed from the lamination direction of resin layers 1 (direction of the normal line to the main surface of resin layers 1), guarding conductor 22 is disposed to cover a side terminal electrode 51 of chip component 5 and cover a gap 100 (see FIG. 2(b)) between side terminal electrode 51 and resin layers 1d and 1e in the vicinity of the side terminal electrode.

Then, after resin layers 1a-1e are sequentially laminated, chip capacitor (chip component) 5 is housed inside open space 10 disposed in resin layers 1d and 1e. Chip capacitor 5 is disposed in such a way that side terminal electrode 51 thereof is in contact with wiring conductor 21 disposed on resin layer 1c for making a connection. Although not shown in the drawings, a bonding material (not shown) made of tin-based solder is disposed at a position where side terminal electrode 51 of chip capacitor 5 contacts with wiring conductor 21 disposed on resin layer 1c for making a connection. Accordingly, as illustrated in FIG. 2(b), gap (clearance) 100 is formed between side terminal electrode 51 of chip capacitor 5 and resin layers 1d and 1e in the obtained laminating body.

Thereafter, the laminating body is thermo-compressed by applying a pressure against the laminating body in the lamination direction while heating it to a temperature at which each resin layer softens to flow. According to the thermo-compression, while at least the surface of each resin layer is made integrated, conducting material 40 filled in the via hole is metalized to become a via conductor 41, and the bonding material, that is, the solder disposed between side terminal electrode 51 of chip capacitor 5 and wiring conductor 21 is also metalized. In other words, the conduction between the in-plane conductor pattern (wiring conductor 21) and the interlayer conductor pattern (via conductor 41) and the conduction between the embedded chip capacitor 5 and wiring conductor 21 are achieved through the thermo-compression process. Moreover, gap 100 around chip component 5 is filled with resin. It should be noted that in the laminating body after the thermo-compression, a clear boundary interface is not present between the resin layers. In this way, a resin multilayer substrate embedded with chip component 5 is obtained.

On the obtained chip component-embedded resin multilayer substrate, a surface electrode 211 and a back electrode 212 are disposed. Thereafter, by connecting a semiconductor chip (mounted component) 6 containing various IC (Integrated Circuit) and the like to surface electrode 211 through the intermediary of a bonding material 7 such as solder on the surface of the chip component-embedded resin multilayer substrate, the chip component-embedded resin multilayer substrate mounted with semiconductor chip 6, that is, the multilayer modular component is obtained.

Figure 5:
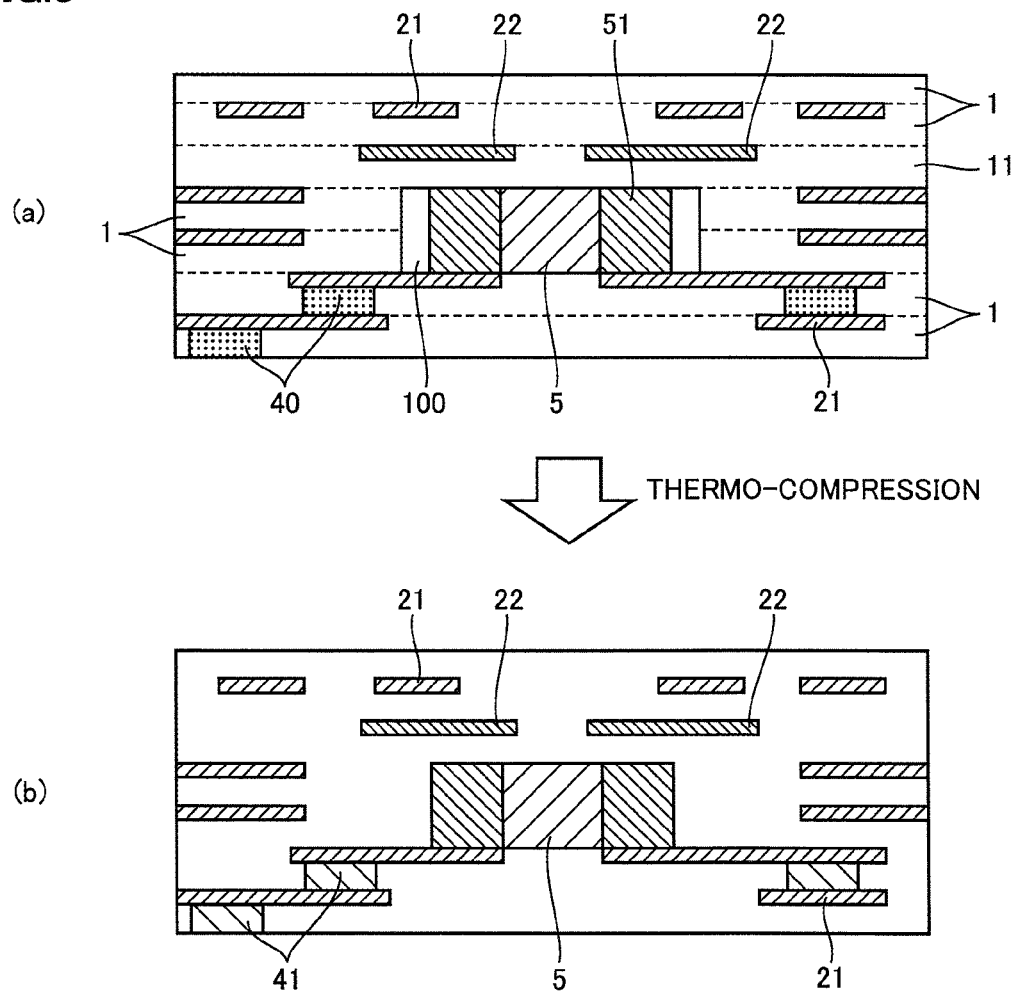
FIG. 5 is another schematic sectional view illustrating a manufacturing step of the chip component-embedded resin multilayer substrate according to Embodiment 1.

In the manufacturing process, as illustrated in FIGS. 4 and 5(a), guarding conductor 22 having a planar shape is disposed to cover at least a part of the boundary between side terminal electrode 51 of the embedded chip capacitor 5 and resin layers 1 when view from the lamination direction of the resin layers. In other words, the planar shaped guarding conductor 22 is disposed to cover gap 100 formed in the laminated resin layers prior to the thermo-compression. Thus, during the thermo-compression of the resin layers, the amount of resin flowing into gap 100 from the upper direction in FIG. 5(a) is reduced, and thereby, it is possible to prevent wiring conductor 21 disposed in the vicinity of the gap from being deformed (FIG. 5(b)).

Figure 6:
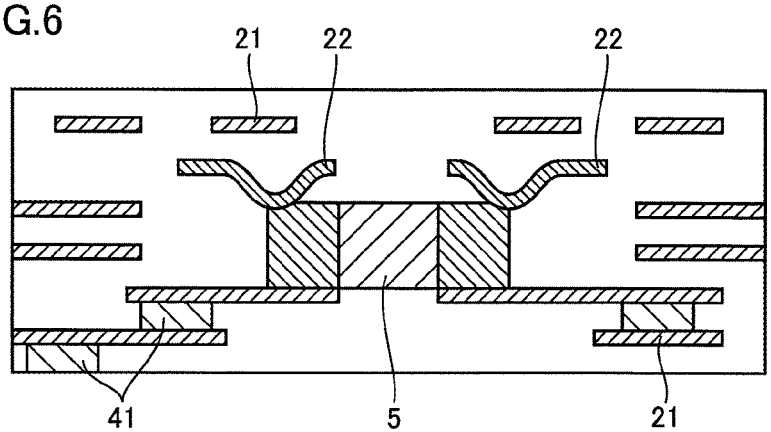
FIG. 6 is another schematic sectional view illustrating a manufacturing step of the chip component-embedded resin multilayer substrate according to Embodiment 1.

As illustrated in FIG. 6, during the thermo-compression, even if guarding conductor 22 is deformed due to the flowing of resin and even worse to contact with chip component 5 due to the deformation of guarding conductor 22, since guarding conductor 22 is electrically isolated from wiring conductor 21 as mentioned above, the electrical characteristics of the chip component-embedded resin multilayer substrate and the modular component will not be affected substantially.

Embodiment 2

Figure 7:
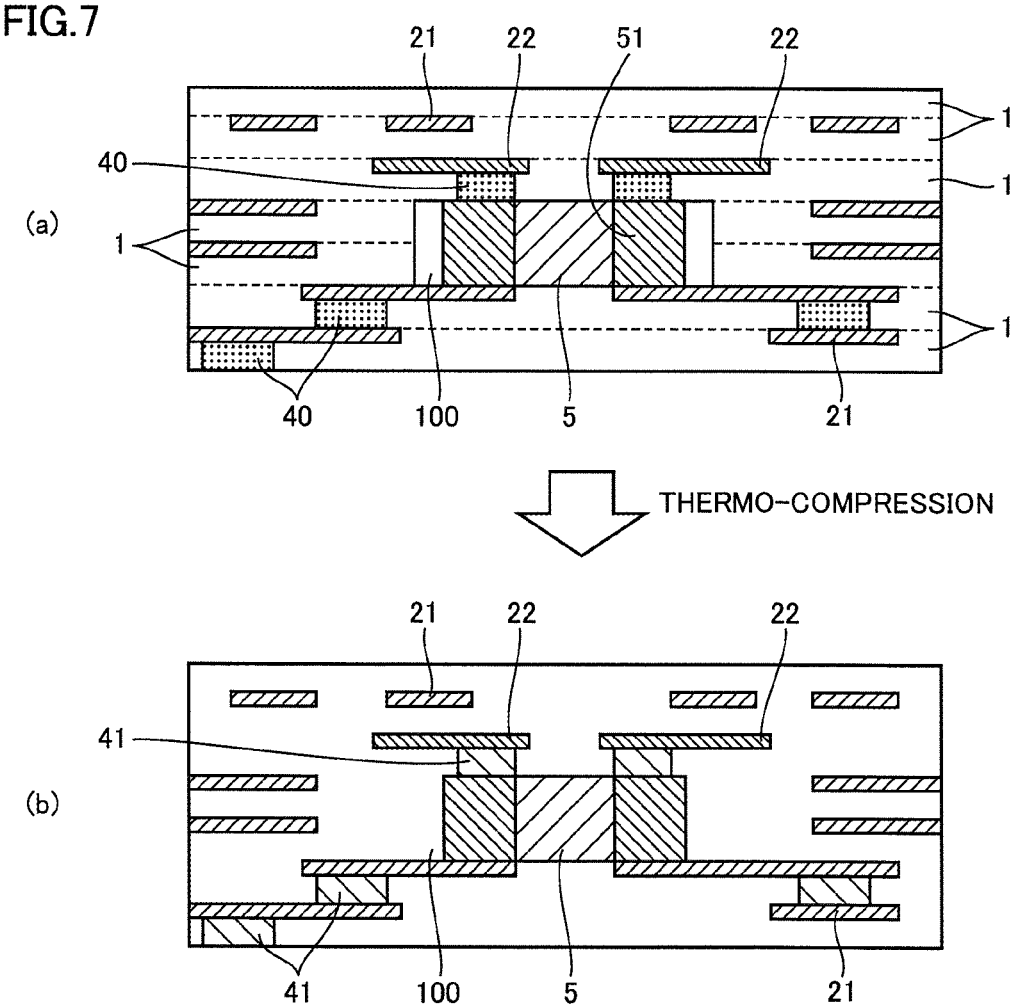
FIG. 7 is a schematic sectional view illustrating a manufacturing step of the chip component-embedded resin multilayer substrate according to Embodiment 2.
Figure 8:
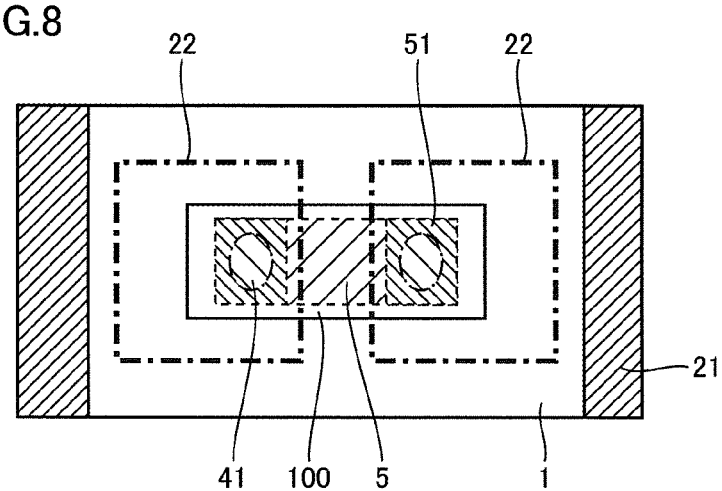
FIG. 8 is a schematic top view illustrating a manufacturing step of the chip component-embedded resin multilayer substrate according to Embodiment 2.

As illustrated in FIGS. 7(b) and 8, it is acceptable that guarding conductor 22 is connected to side terminal electrode 51 of chip component 5 through the intermediary of via conductor 41. Since via conductor 41 is metalized from conducting material 40 during the thermo-compression (see FIG. 7(a)), it is harder than resin layer 1. Therefore, it is possible to prevent guarding conductor 22 from being deformed against the flowing of resin during the thermo-compression. Moreover, it is possible to prevent chip component 5 from tilting accidentally or from floating out of wiring conductor 22 for making a connection. The other steps are similar to those of Embodiment 1, and the description thereof will not be repeated.

Embodiment 3

Figure 9:
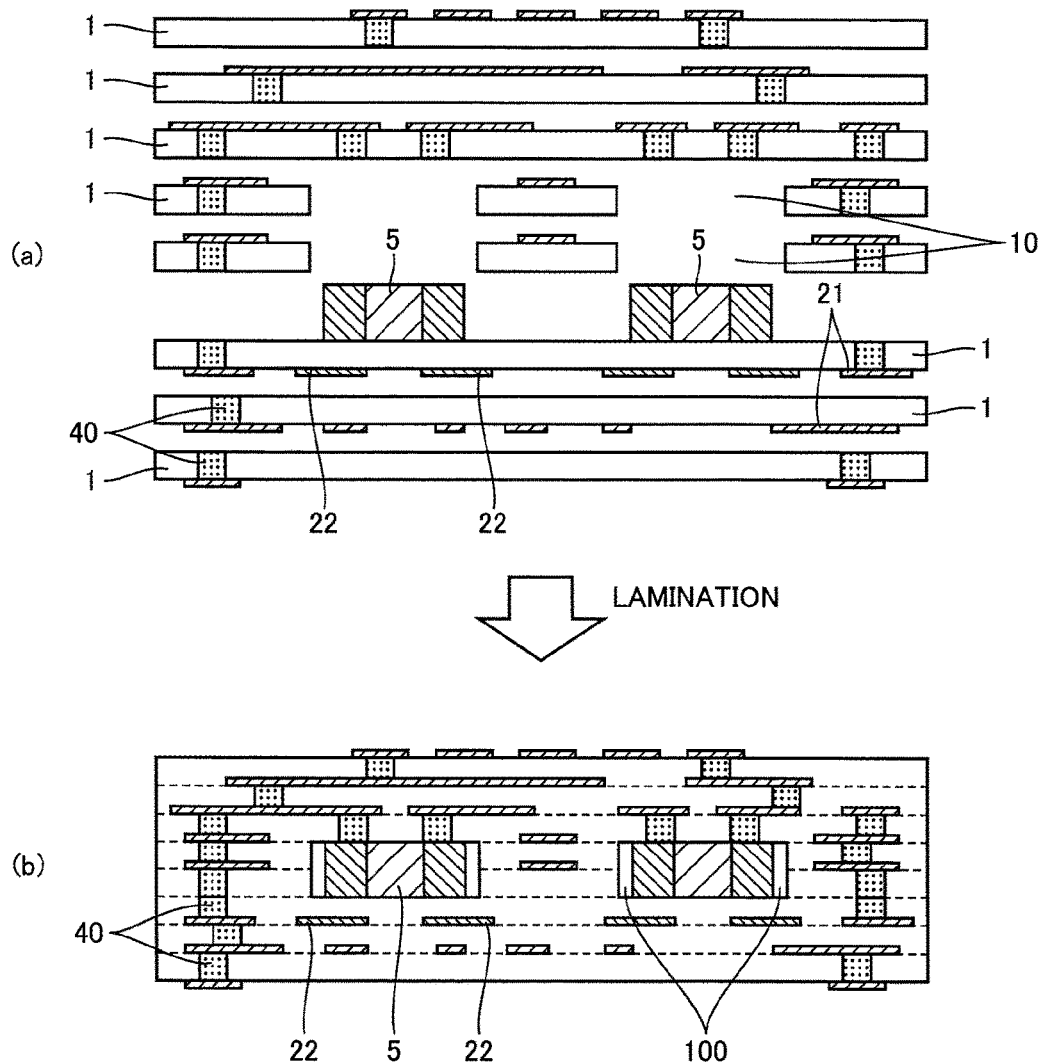
FIG. 9 is a schematic sectional view illustrating a manufacturing step of the chip component-embedded resin multilayer substrate according to Embodiment 3.
Figure 10:
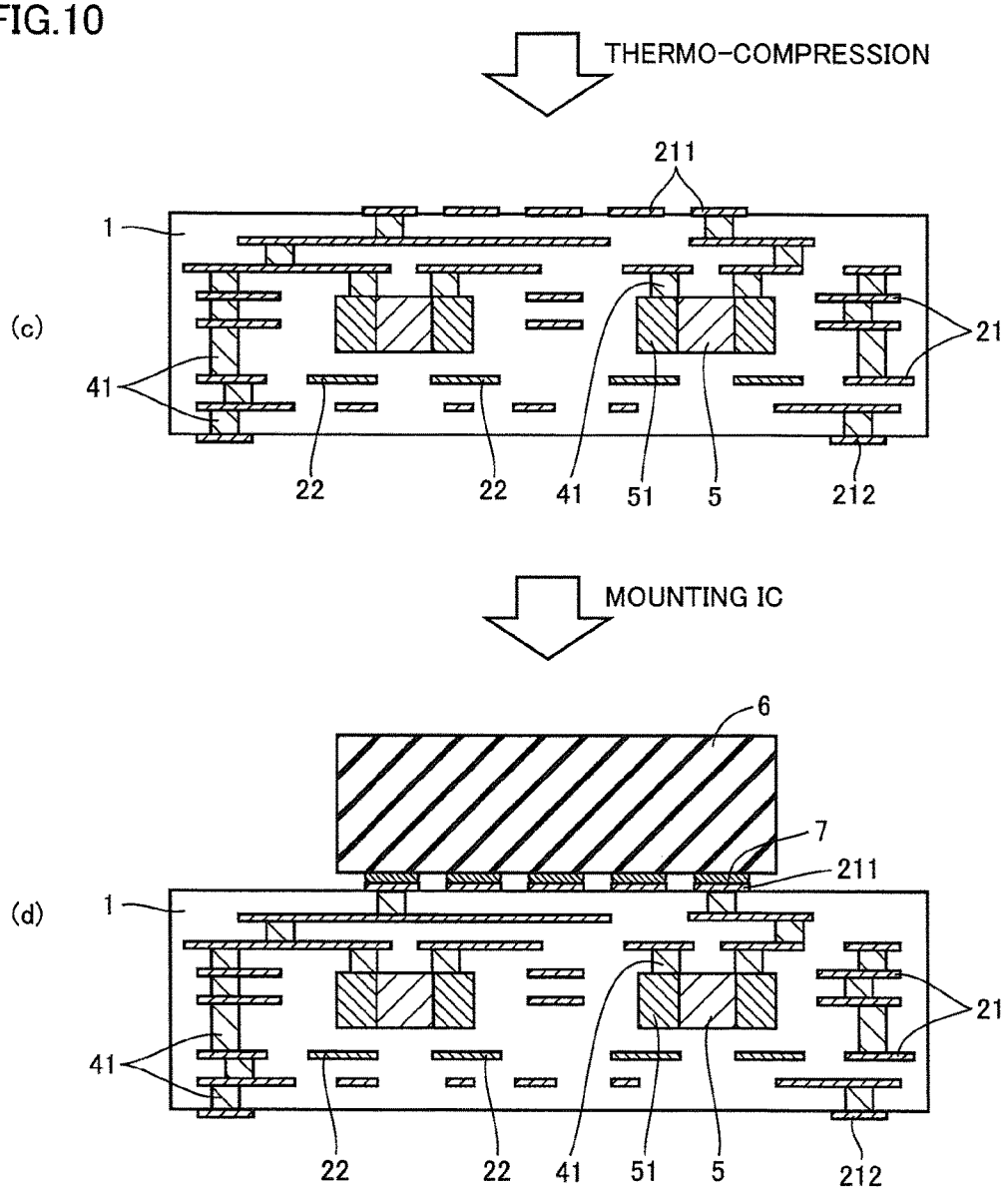
FIG. 10 is another schematic sectional view illustrating a manufacturing step of the chip component-embedded resin multilayer substrate according to Embodiment 3.

The chip component-embedded resin multilayer substrate and the multilayer modular component can be obtained according to the process illustrated in FIGS. 9 and 10. In the present embodiment, side terminal electrode 51 of chip component 5 and via conductor 41 are directly joined through wiring connection (FIG. 10(c)). Specifically, as conducting material 40 filled in the via hole is metalized during the thermo-compression of the laminating body, side terminal electrode 51 of chip component 5 and via conductor 41 are connected firmly through metal bonding. Accordingly, the embedded chip component 5 and wiring conductor 21 disposed in the multilayer substrate can be connected without using a bonding material such as solder. The other steps are similar to those of Embodiment 1, and the description thereof will not be repeated.

1, 1a, 1b, 1c, 1d, 1e, 1f, 1g, 1h, 1i: resin layer; 10: open space; 100: gap; 21, 21a, 21b: wiring conductor; 211: surface conductor; 212; back conductor; 22: guarding conductor (guarding member); 40: conductor material; 41: via conductor; 5: chip component (chip capacitor); 51: side terminal electrode; 6: semiconductor chip (mounted component); 7: bonding material

The invention claimed is:

1. A chip component-embedded resin multilayer substrate, comprising:
   a laminated body having a plurality of resin layers laminated;
   a predetermined wiring conductor disposed in said laminated body; and
   a chip component embedded in said laminated body and having a side terminal electrode, said chip component-embedded resin multilayer substrate further comprising a guarding member comprising a conductor material electrically isolated from said wiring conductor to cover an entire part of a boundary between said side terminal electrode and said resin layers when viewed in a plane view from a lamination direction of said laminated body,
   said guarding member being not electrically connected to said chip component, and
   said guarding member comprising a material having a melting point higher than a temperature at which said resin layer begins to flow.

2. The chip component-embedded resin multilayer substrate according to claim 1, wherein at least one resin layer is interposed between said guarding conductor and said side terminal electrode of said chip component.

3. The chip component-embedded resin multilayer substrate according to claim 1, wherein said chip component has two side terminal electrodes disposed respectively on opposed end surfaces, and two independent guarding conductors are disposed in a vicinity of each of said side terminal electrodes, respectively.

4. The chip component-embedded resin multilayer substrate according to claim 1, wherein another chip component is mounted on a surface of said laminating body.

5. A manufacturing method of a chip component-embedded resin multilayer substrate including a laminated body having a plurality of resin layers laminated, a predetermined wiring conductor disposed in said laminated body, and a chip component embedded in said laminated body and having a side terminal electrode, comprising:
- a lamination step of laminating the plurality of said resin layers so as to embed said chip component in an open space disposed in a part of said resin layers; and
- a thermo-compression step of thermo-compressing said laminated body embedded with said chip component,
- said manufacturing method further comprising, before said thermo-compression step, providing a guarding member comprising a conductor material electrically isolated from said wiring conductor to cover an entire part of a gap formed between said side terminal electrode and said resin layers when viewed in a plane view from a lamination direction of said laminating body, said guarding member being not electrically connected to said chip component, and
- said guarding member comprising a material having a melting point higher than a temperature at which said resin layer begins to flow.

* * * * *